United States Patent
Chen

(10) Patent No.: US 11,943,890 B2
(45) Date of Patent: Mar. 26, 2024

(54) TRIGGER TYPE SELF-LOCKING DEVICE FOR SERVERS AND RACKMOUNT CABINETS

(71) Applicant: MARTAS PRECISION SLIDE CO., LTD., New Taipei (TW)

(72) Inventor: Wan-Lai Chen, New Taipei (TW)

(73) Assignee: MARTAS PRECISION SLIDE CO., LTD., New Taipei (TW)

( * ) Notice: Subject to any disclaimer, the term of this patent is extended or adjusted under 35 U.S.C. 154(b) by 0 days.

(21) Appl. No.: 17/724,507

(22) Filed: Apr. 20, 2022

(65) Prior Publication Data
US 2023/0345660 A1 Oct. 26, 2023

(51) Int. Cl.
*A47B 88/43* (2017.01)
*H05K 7/14* (2006.01)

(52) U.S. Cl.
CPC ................. *H05K 7/1489* (2013.01)

(58) Field of Classification Search
CPC ...... E05B 65/46; E05B 65/461; E05B 65/462; E05B 65/463; E05B 65/464; E05B 65/465; E05B 65/466; H05K 7/1489; A47B 88/43; A47B 88/423; A47B 2088/4235; H02K 7/183; H02K 7/1488; H02K 7/1489
See application file for complete search history.

(56) References Cited

U.S. PATENT DOCUMENTS

| | | | |
|---|---|---|---|
| 2002/0117948 A1* | 8/2002 | Le | A47B 88/57 312/334.44 |
| 2004/0056572 A1* | 3/2004 | Chen | A47B 88/473 312/333 |
| 2014/0363108 A1* | 12/2014 | Chen | A47B 88/43 384/22 |

* cited by examiner

*Primary Examiner* — Terrell L McKinnon
*Assistant Examiner* — Jerry Olivier
(74) *Attorney, Agent, or Firm* — Fei-Hung Yang

(57) ABSTRACT

A trigger type self-locking device for servers and rackmount cabinets includes a trigger base and a moving trigger installed at an end of a slide rail moving section of a server. The rackmount cabinet has a latch base fixed to a slide rail fixed section for locking the slide rail moving section into the rackmount cabinet. The moving trigger is pivoted to the trigger base for passing a snap hook and a pulling part of the moving trigger out from the trigger base. An elastic plate installed at the middle of the moving trigger produces a resilient force of driving the snap hook and pulling part. During operation, the moving trigger can complete a locking connection with the latch base quickly and intuitively perform locking and unlocking operation to greatly simplify the components and reduce the cost and difficulty of the manufacturing.

8 Claims, 8 Drawing Sheets

TRIGGER TYPE SELF-LOCKING DEVICE FOR SERVERS AND RACKMOUNT CABINETS

BACKGROUND

Technical Field The present disclosure relates to the field of industrial computer rackmount slide rails, and more particularly relates to a trigger type self-locking device for servers and rackmount cabinets, and this device is capable of quickly completing a locking connection with a latch base without requiring the use of any tool, intuitively performing the operations of locking and unlocking, greatly simplifying components, and reducing the manufacturing cost, assembling cost, and level of manufacturing difficulty.

Description of Related Art

As information technology advances rapidly, e-Business and cloud storage have become a trend, and general personal computers can no longer meet such requirements, so that various professional network equipment have been developed, among which rackmount servers placed in a rackmount cabinet for central management are used extensively. Rackmount server is a server with an appearance designed according to the standard of the system, which can be considered as a tower server with an optimized structure. In order to reduce the space occupied by the server as much as possible, each server is designed in a flat shape similar to that of a drawer. In the rackmount cabinet, the width of the aforementioned servers is 19 inches, and the height is measured in the unit of U (1U=1.75 inches=44.45 millimeters). However, these rackmount servers are slidably mounted into the rackmount cabinet to facilitate their access and swap, and they must be fixed when not in use. The rackmount servers are fixed by locking screws at two ends of the outer side of the rackmount cabinet, and it is necessary to remove the screws for access or swap, and thus requiring much time and causing inconvenience. In addition, a buckle mechanism can be used to fix the server chassis into the rack of the rackmount cabinet. Although this way can save the time of removing the screws, the buckle mechanism cannot be applied universally to the present existing servers of different heights, which also cause inconvenience during installation.

Therefore, a slide rail is introduced on the market to replace the traditional fixing blocks or screws for the fixation of the servers. The slide rail has the pulling and stretching characteristics as well as the stacking and contracting characteristics, such that the servers can be pulled and drawn out from the rackmount cabinet for expansion, replacement, examination and maintenance, or pushed into the rackmount cabinet for storage, thus greatly improving the convenience of the maintenance of the traditional rackmount servers. During installation, the slide rail of this sort is fixed inside the rackmount cabinet through a bracket which is usually matched with a set of fasteners, and the slide rail together with the server are fixed to two fixing holes with a corresponding height in the rackmount cabinet. After a slide rail moving section is fixed to the server, the server can be pulled outward. In order to prevent the server from sliding out during use, a corresponding latching device is designed, which usually uses a movable fastener with a latch base fixed on the rackmount cabinet to position the server. In an application, it is only necessary to release the movable fastener from the latch base to pull out the server. There are many designs for the movable fasteners of this kind with various different operation methods, but the movable fastener has too many components and thus incurring higher manufacturing cost, assembling cost and level of manufacturing difficulty, and most of the operation methods are not intuitive enough and require proper training to operate the movable fasteners. Obviously, the traditional movable fasteners require improvements.

In view of the aforementioned drawbacks, this discloser specially designed a trigger type self-locking device for servers and rackmount cabinets, which is capable of quickly completing a locking connection with a latch base without using any tool, intuitively performing the operations of locking and unlocking, greatly simplifying components, and reducing the manufacturing cost, the assembling cost, and the level of manufacturing difficulty.

SUMMARY

Therefore, it is a primary objective of the present disclosure to provide a trigger type self-locking device for servers and rackmount cabinets, and the trigger type self-locking device includes a trigger base and a moving trigger installed at an end of a slide rail moving section on a surface of a server, and the rackmount cabinet has a latch base fixed to a slide rail fixed section and provided for temporarily locking the slide rail moving section together with the server into the rackmount cabinet. The moving trigger has a snap hook, a pulling part and an elastic plate, which can complete the locking and unlocking operation of the latch base quickly, so that this disclosure not just can provide an intuitive operation to improve the convenience of the operation, but also can greatly simplify the components to reduce the manufacturing cost, the assembling cost and the level of manufacturing difficulty.

To achieve the aforementioned and other objectives, the present disclosure provides a trigger type self-locking device for servers and rackmount cabinets installed at an end of a slide rail moving section on a surface of a server, and the rackmount cabinet has a latch base fixed to a slide rail fixed section and provided for temporarily locking the slide rail moving section together with the server into the rackmount cabinet. The trigger type self-locking device includes: a trigger base, having a pivot part installed therein, a first opening formed on pivot part and under the the trigger base, a second opening formed on the trigger base and at the front of the pivot part, and a stop block disposed between the second opening and the pivot part; and a moving trigger, being substantially J-shaped, and having a pivot hole formed at a bending position of the moving trigger for movably pivoting the pivot part, and the moving trigger having a pulling part disposed at an end extending downwardly along the pivot hole, and a snap hook disposed linearly at another end of the moving trigger and passed out from the second opening, and an elastic plat being installed between the snap hook and the pivot hole and extending obliquely along a bottom edge of the moving trigger for limiting the moving trigger from being assembled onto the stop block, such that a linkage is formed after the moving trigger is assembled to the trigger base, and during operation, the snap hook is under the effect of the restoring elastic force of the elastic plate, so that the moving trigger generates a reciprocating swing inside the trigger base to quickly complete a locking connection with the latch base.

In an embodiment of this disclosure, the trigger type self-locking device further includes a hook guard extending from and disposed on a side of the trigger base opposing to the first opening, and the hook guard is in a shape corresponsive to that of the moving trigger for stopping the moving trigger from being pulled further outwardly. The trigger type self-locking device further includes a safety lock, and a moving hole formed between the second opening and the pivot part, and the moving trigger has a safety hole configured to be corresponsive to the safety lock, and the safety lock is movably passed into the moving hole, and an end of the safety lock remains at the exterior of the trigger base, and the safety lock is passed into the safety hole to lock the moving trigger. In addition, this discloser further provided the following two measures during the locking operation:

1. The safety lock has a sliding rod installed thereon, and an end of the safety lock remaining at the exterior of the trigger base having an elastic element, and a camber formed around the periphery of the moving hole, and the elasticity of the elastic element is provided for driving the sliding rod to rotate along the camber to pass the safety lock into the safety hole, and the safety lock has a knob installed at an end which remains at the exterior of the trigger base, for facilitating a rotational operation of the safety lock.

2. The trigger type self-locking device has an elastic element sheathed on an end of the safety lock which remains in the trigger base, and a limit surface configured to located on another end of the safety lock and aligned evenly and abutting against a surface of the moving trigger, and the elasticity of the elastic element is provided for passing the safety lock into the safety hole, and an end of the elastic element abuts against the limit surface. The safety lock can be operated relative to the safety hole either by rotation or pulling to prevent wrong operations after locking.

In another embodiment of this disclosure, a pair of installation hooks are configured to be opposite to a side of the second opening and provided for fixing the slide rail moving section. In addition, the elastic plate is formed by bending an edge of the moving trigger and punching thin a position adjacent to where the elastic plate connected to the moving trigger to form an elastic restoring section, so as to achieve the practicality of the device after installation and during use.

DESCRIPTION OF THE EMBODIMENTS

This disclosure will now be described in more detail with reference to the accompanying drawings that show various embodiments of this disclosure.

Figure 1:
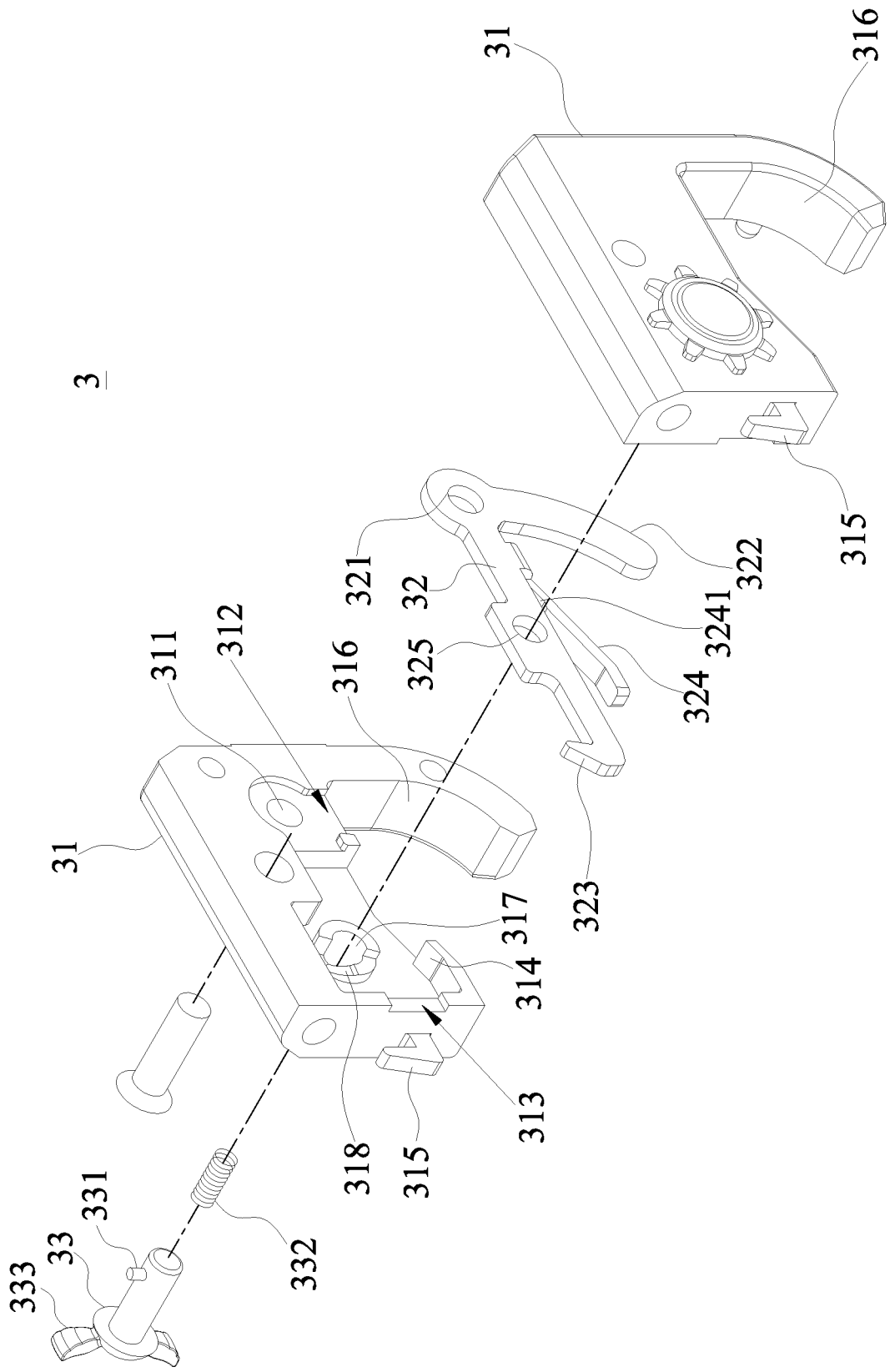
FIG. 1 is an exploded view of a first preferred embodiment of this disclosure.
Figure 2:
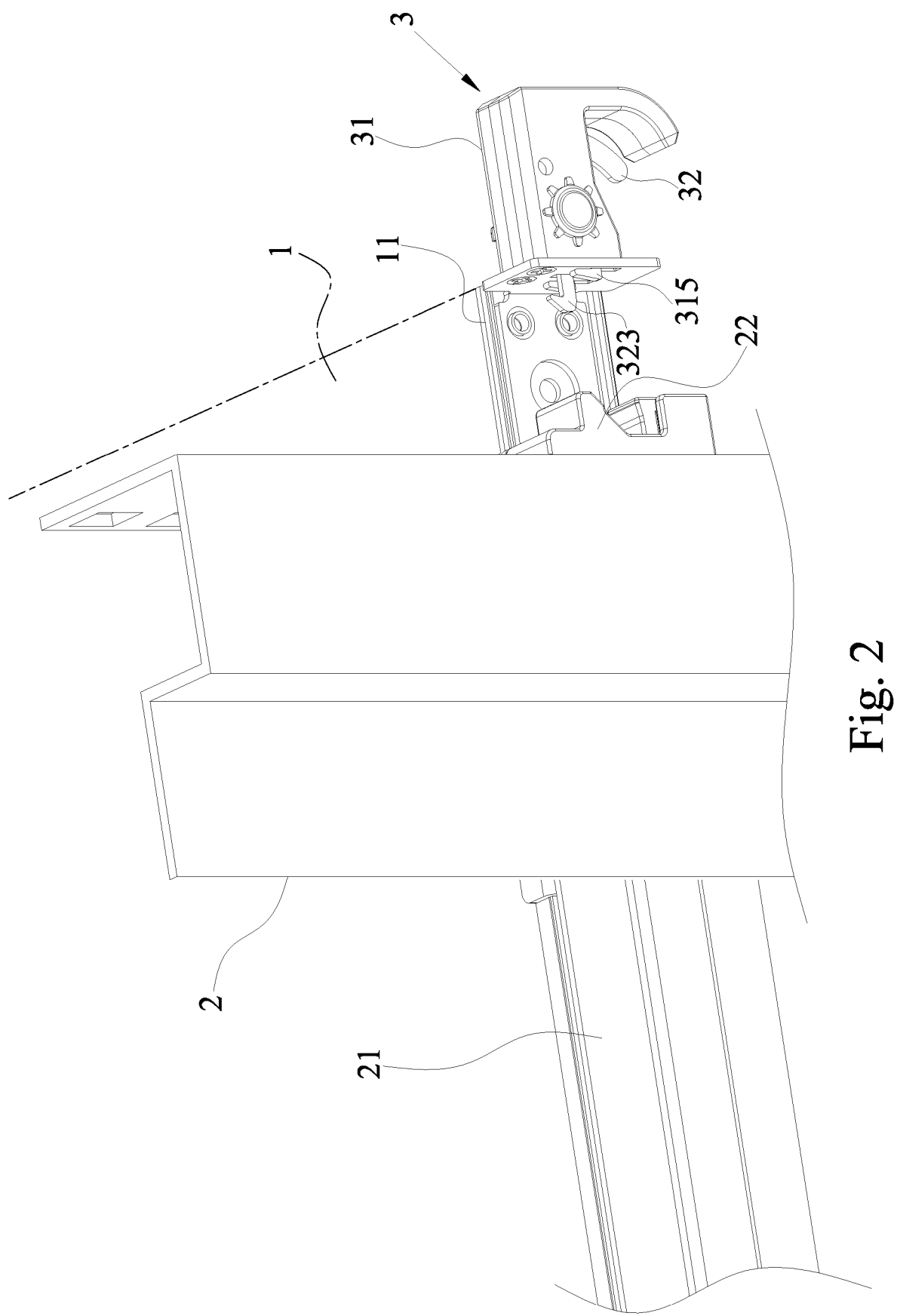
FIG. 2 is a perspective view of the first preferred embodiment of this disclosure.
Figure 3A:
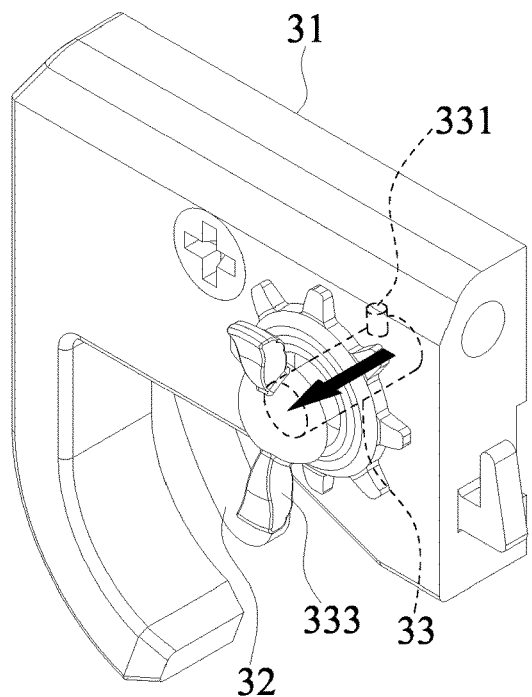
FIG. 3A is a first schematic view showing an unlocking status of the first preferred embodiment of this disclosure.
Figure 3B:
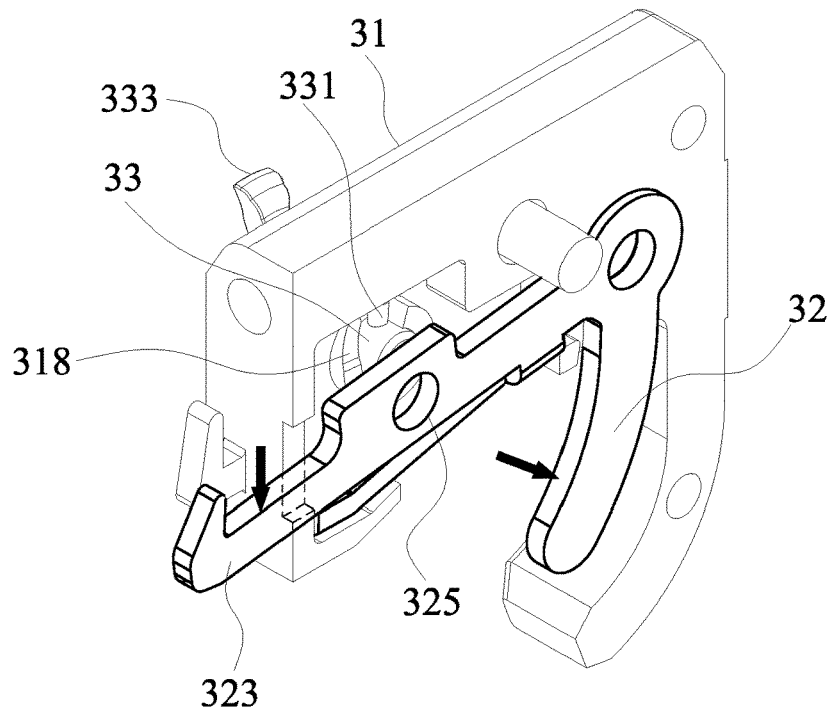
FIG. 3B is a second schematic view showing an unlocking status of the first preferred embodiment of this disclosure.
Figure 4A:
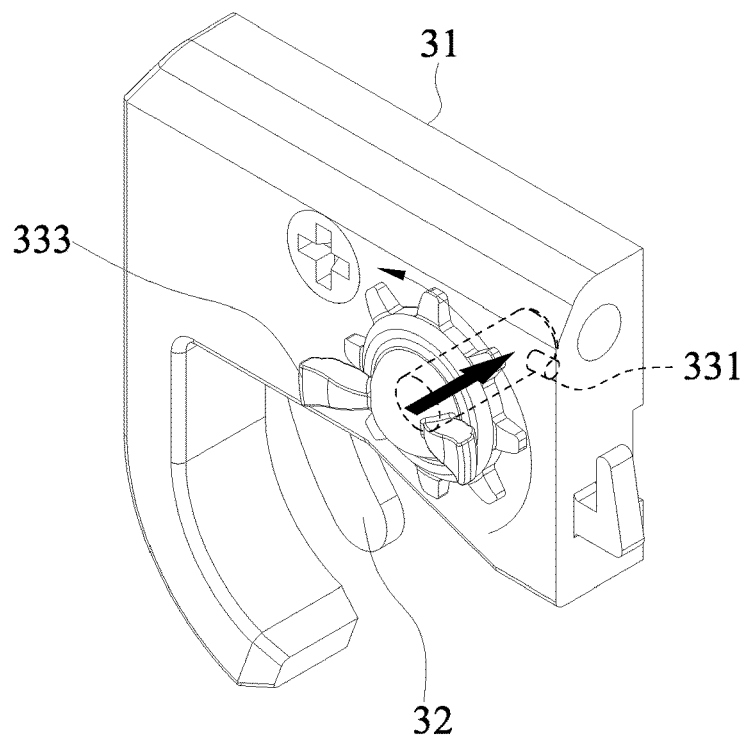
FIG. 4A is a first schematic view showing a locking status of the first preferred embodiment of this disclosure.
Figure 4B:
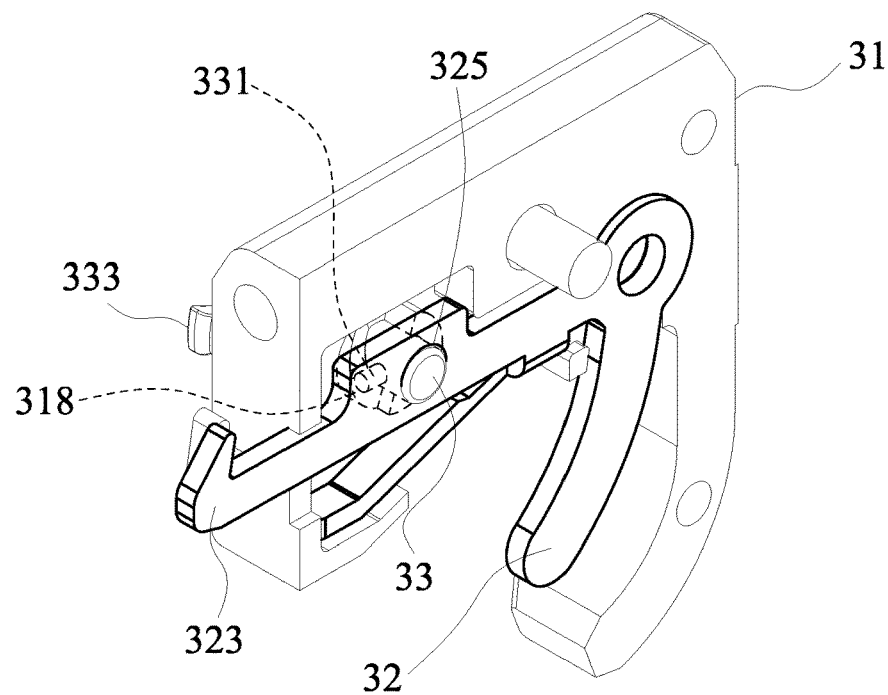
FIG. 4B is a second schematic view showing a locking status of the first preferred embodiment of this disclosure.

With reference to FIGS. 1, 2, and 3A~4B for the exploded view and perspective view of a trigger type self-locking device, and the schematic views showing various status of its operation in accordance with the first embodiment of this disclosure respectively, the trigger type self-locking device 3 of a server 1 and a rack 2 includes a trigger base 31 and a moving trigger 32 installed at an end of a slide rail moving section 11 on a surface of the server 1, and the rack 2 has a latch base 22 for fixing the slide rail fixed section 21 to lock the slide rail moving section 11 together with the server 1 in the rack 2 temporarily.

The trigger base 31 is a two-piece engaging structure having a pivot part 311 installed therein, and the surface of the trigger base 31 under the pivot part 311 has a first opening 312, and the trigger base 31 in front of the pivot part 311 has a second opening 313, and a stop block 314 is disposed between the second opening 313 and the pivot part 311. It is noteworthy that a pair of installation hooks 315 are disposed on a side facing the second opening 313 for fixing the slide rail moving section 11.

The moving trigger 32 is designed as a J-shaped sheet structure and has a pivot hole 321 formed at a bent position for movably pivoting the pivot part 311, and an end of the moving trigger 32 extending downwardly along the pivot hole 321 has a pulling part 322, and a snap hook 323 linearly disposed at another end and passed out from the second opening 313. In addition, an elastic plate 324 is disposed between the snap hook 323 and the pivot hole 321 and obliquely extending along the bottom edge of the moving trigger 32 for limiting its being assembled onto the stop block 314, such that a linkage is formed after the moving trigger 32 is assembled to the trigger base 31. During operation, the snap hook 323 is under the effect of the restoring elastic force of the elastic plate 324, such that the moving trigger 32 generates a reciprocating swing inside the trigger base 31 to quickly complete a locking connection with the latch base 22. It is noteworthy that there is a special feature of the manufacture of the elastic plate 324 of this disclosure, wherein the elastic plate 324 is manufactured by bending an edge of the moving trigger 32 and punching thin a position adjacent to where the elastic plate connected to the moving trigger to form an elastic restoring section 3241. Since the thickness is reduced after punching, the elastic plate can have better restoring elasticity.

In addition, the trigger type self-locking device 1 of this disclosure further includes a hook guard 316 extending from and disposed on a side of the trigger base 31 opposing to the first opening 312, and the hook guard 316 is in a shape corresponsive to that of the moving trigger 32 for stopping the moving trigger 32 from being pulled further outward. The rigger type self-locking device 1 of this disclosure further includes a safety lock 33, and a moving hole 317 formed between the second opening 313 and the pivot part 311, and the moving trigger 32 has a safety hole 325 configured to be corresponsive to the safety lock 33, and the safety lock 33 is movably passed into the moving hole 317, and an end of the safety lock 33 remains at the exterior of the trigger base 31, and the safety lock 33 is passed into the safety hole 325 to lock the moving trigger 32. It is noteworthy that the safety lock 33 of this embodiment as shown in FIGS. 3A~4B has a sliding rod 331 installed thereon, and an end of the safety lock 33 remains at the exterior of the trigger base 31 having an elastic element 332, and a camber 318 is formed around the periphery of the moving hole 317, and the elasticity of the elastic element 332 is provided for driving the sliding rod 331 to rotate along the camber 318 to pass the safety lock 33 into the safety hole 325. In order to facilitate the rotational operation, the safety lock 33 has a knob 333 disposed at an end remaining at the exterior of the trigger base 31 for facilitating the rotation of the safety lock 33 and the generation of the telescopic action of the safety lock 33, so as to achieve the effect of locking or unlocking at the safety hole 325.

Figure 5:
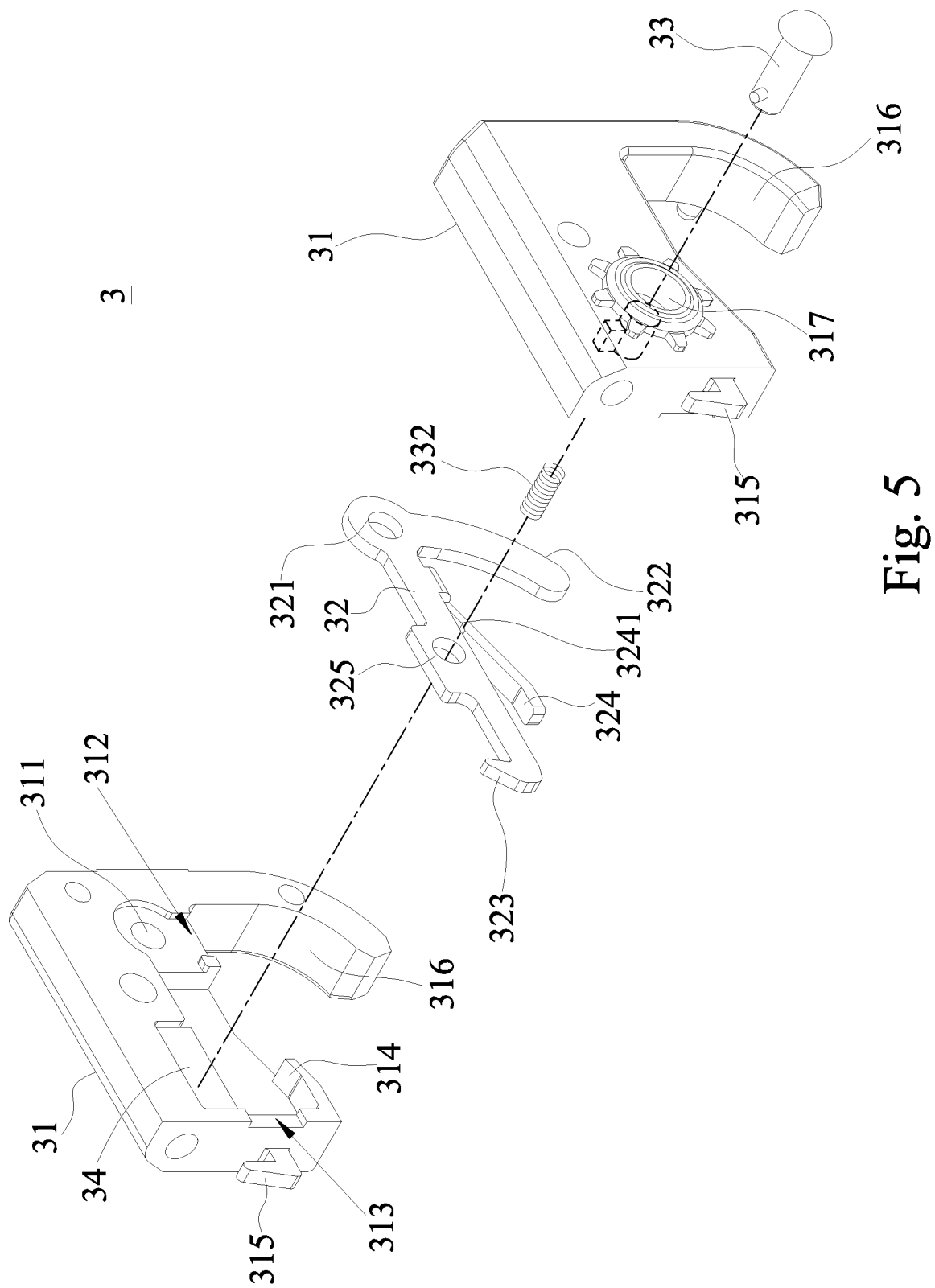
FIG. 5 is an exploded view of a second preferred embodiment of this disclosure.
Figure 6:
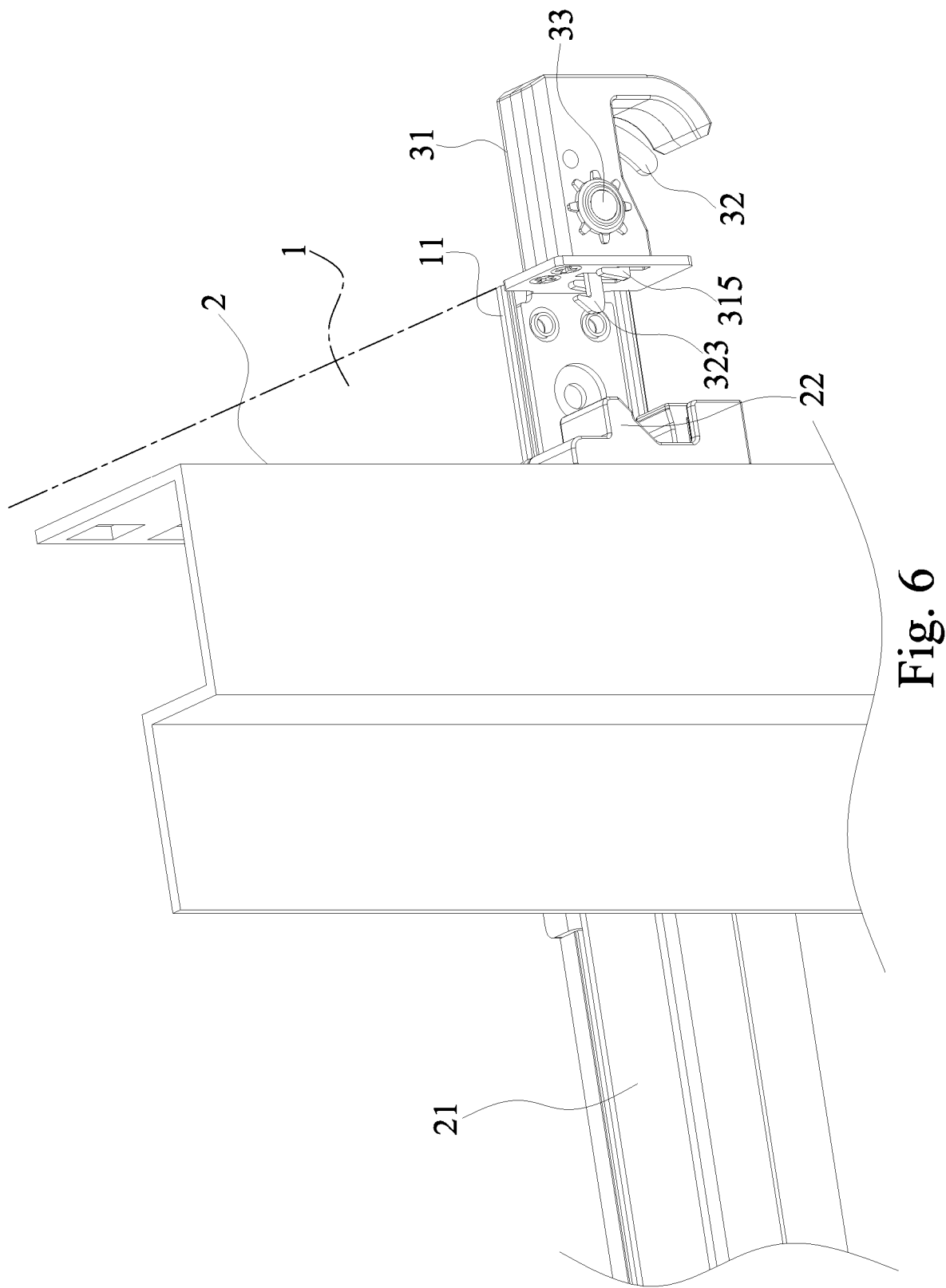
FIG. 6 is a perspective view of the second preferred embodiment of this disclosure.
Figure 7A:
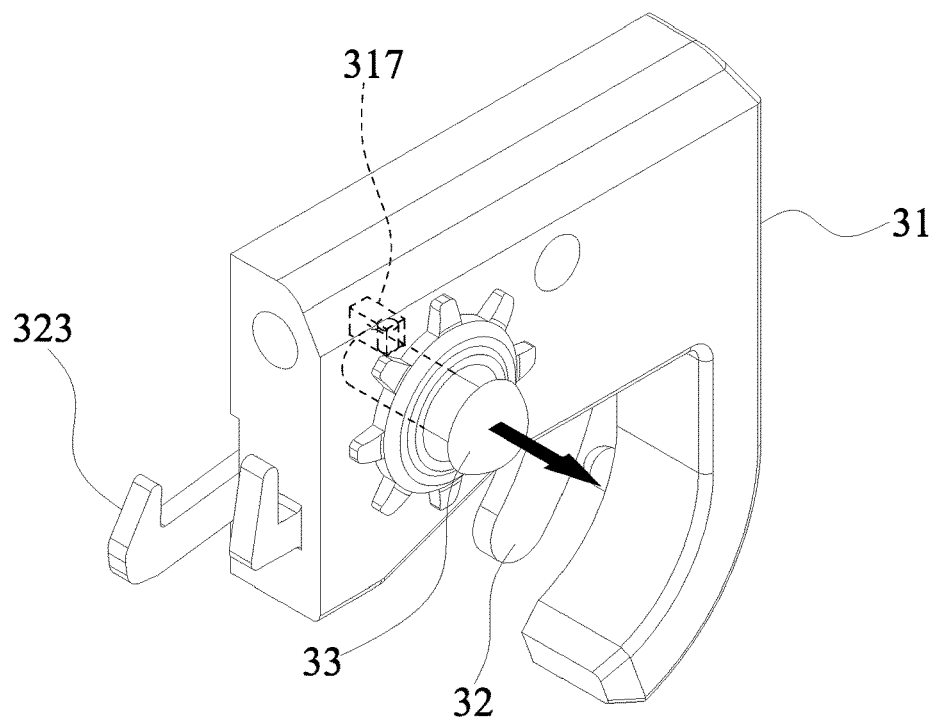
FIG. 7A is a first schematic view showing an unlocking status of the second preferred embodiment of this disclosure.
Figure 7B:
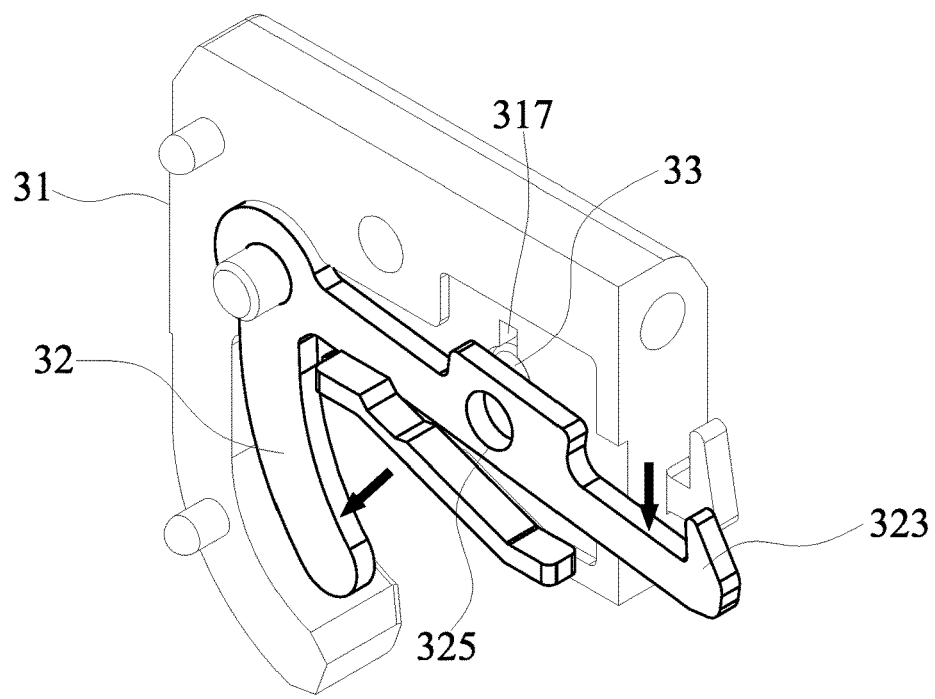
FIG. 7B is a second schematic view showing an unlocking status of the second preferred embodiment of this disclosure.
Figure 8A:
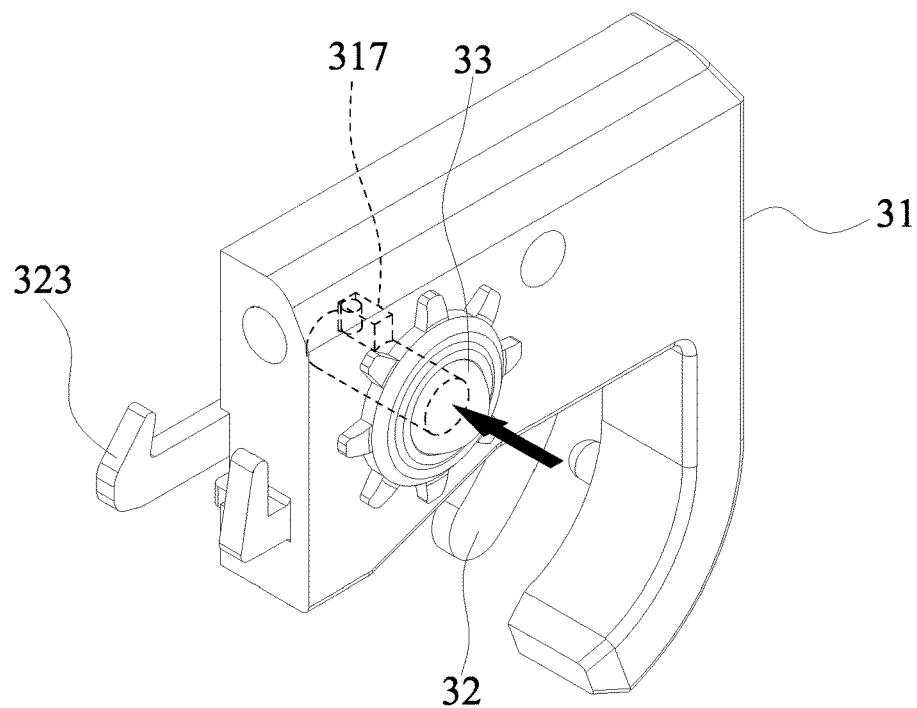
FIG. 8A is a first schematic view showing a locking status of the second preferred embodiment of this disclosure.
Figure 8B:
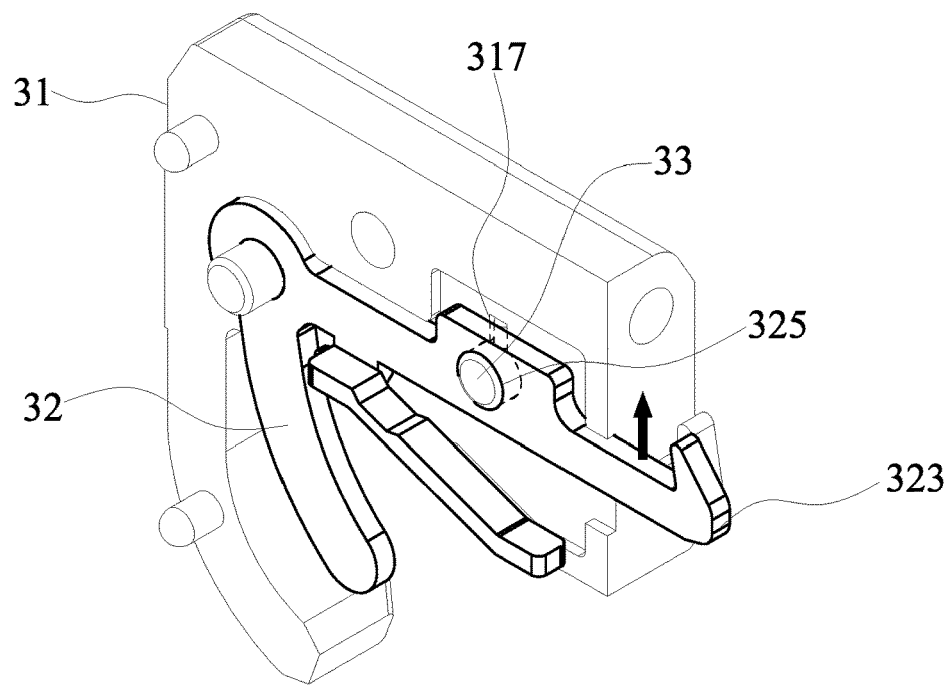
FIG. 8B is a second schematic view showing a locking status of the second preferred embodiment of this disclosure.

With reference to FIGS. 5, 6 and 7A~8B for the exploded view and perspective view of a trigger type self-locking device, and the schematic views showing different operating statuses of the trigger type self-locking device in accordance with the second embodiment of this disclosure respectively, the components of the second embodiment are substantially the same as those of the first embodiment, except that the safety lock 33 of the second embodiment has an elastic element 332 sheathed on an end remaining inside the trigger base 31, and a limit surface 34 disposed at another opposite end of the safety lock 33 and evenly aligned and abutted against a surface of the moving trigger 32, and the elasticity of the elastic element 332 is provided for passing the safety lock 33 into the safety hole 325, and an end of safety lock 22 abuts against the limit surface 341 to define a locked status. On the contrary, the safety lock 33 can be pulled outwardly to separate the safety lock 33 from the safety hole 325 to define an unlocked status in order to operate the moving trigger 32.

In this way, when the trigger type self-locking device 1 of this disclosure is used, the moving trigger 32 is latched into the latch base 22 to lock the safety lock 33 (by rotation or insertion) to complete the locking action, such that the moving trigger 32 cannot be operated. If it is necessary to pull out the server 1, the safety lock 33 is opened (by rotating it in an opposite direction or pulling it out) to complete the unlocking action. When the server 1 is pulled out, the pulling part 322 is triggered to produce an operation similar to the firing of a pistol, such that the snap hook 323 is rotated in an opposite direction using the pivoting position as a fulcrum to separate the latch base 22. In other words, the pulling part 322 and the hook guard 316 are the force applying positions, and the force pulls the server 1 out in an extending direction of the slide rail moving section 11. In this disclosure, the moving trigger 32 comes with a design of an integrally formed elastic plate 324, wherein two components are simplified and combined into one piece to achieve the functions such as compression and restoration, in addition to using the restoring characteristics of the metal material itself and punching technology, so that a simplified structure can be obtained to reduce the manufacturing and assembling costs and provide users with convenient and effective intuitive operations.

Listing of claims:

1. A trigger type self-locking device for servers and rackmount cabinets, installed at an end of a slide rail moving section on a surface of a server, and the rackmount cabinet having a latch base fixed to a slide rail fixed section and provided for temporarily locking the slide rail moving section together with the server into the rackmount cabinet, comprising:

a trigger base, having a pivot part installed therein, the pivot part comprising a pin and a hole, a first opening formed on the trigger base under the pivot part, a second opening formed on the trigger base and at the front of the pivot part, and a stop block disposed between the second opening and the pivot part; and a moving trigger, being substantially J-shaped, and having a pivot hole formed at a curved portion of the moving trigger for movably pivoting the pivot part, and the moving trigger having a pulling part disposed at an end extending downwardly along the pivot hole, and a snap hook disposed linearly at another end of the moving trigger and passed out from the second opening, and an elastic plate being installed between the snap hook and the pivot hole and extending obliquely along a bottom edge of the moving trigger, and the elastic plate is assembled on the stop block and limits the moving trigger, such that a linkage is formed after the moving trigger is assembled to the trigger base, and during operation, the snap hook is under the effect of restoring elastic force of the elastic plate, so that the moving trigger generates a reciprocating swing inside the trigger base to complete a locking connection with the latch base.

2. The trigger type self-locking device for servers and rackmount cabinets according to claim 1, further comprising: a hook guard, extending from and disposed on a side of the trigger base opposing to the first opening, and the hook guard being in a shape corresponsive to that of the moving trigger for stopping the moving trigger from being pulled further outwardly.

3. The trigger type self-locking device for servers and rackmount cabinets according to claim 2, further comprising: a safety lock, and a moving hole formed between the second opening and the pivot part, and the moving trigger having a safety hole configured to be corresponsive to the safety lock, and the safety lock being movably passed into the moving hole, and an end of the safety lock remaining at the exterior of the trigger base, and the safety lock being passed into the safety hole to lock the moving trigger.

4. The trigger type self-locking device for servers and rackmount cabinets according to claim 3, wherein the safety lock has a sliding rod installed thereon, and the end of the safety lock remaining at the exterior of the trigger base having an elastic element, and a camber formed around the periphery of the moving hole, and elasticity of the elastic element is provided for driving the sliding rod to rotate along the camber to pass the safety lock into the safety hole.

5. The trigger type self-locking device for servers and rackmount cabinets according to claim 4, wherein the safety lock has a knob installed at the end which remains at the exterior of the trigger base, for facilitating a rotational operation of the safety lock.

6. The trigger type self-locking device for servers and rackmount cabinets according to claim 3, further comprising an elastic element sheathed on an end of the safety lock which remains in the trigger base, and a limit surface configured to located on another end of the safety lock and aligned evenly and abutting against a surface of the moving trigger, and elasticity of the elastic element being provided for passing the safety lock into the safety hole, and an end of the elastic element abutting against the limit surface to pull the safety lock outwardly to complete an unlocking action.

7. The trigger type self-locking device for servers and rackmount cabinets according to claim 1, further comprising a pair of installation hooks configured on opposite sides of the second opening and provided for fixing the slide rail moving section.

8. The trigger type self-locking device for servers and rackmount cabinets according to claim 1, wherein the elastic plate comprises a bending position near an edge of the elastic plate, and an elastic restoring section is formed by punching thin a position adjacent to where the elastic plate connected to the moving trigger.

\* \* \* \* \*